United States Patent [19]

Tajika et al.

[11] Patent Number: 4,746,372
[45] Date of Patent: May 24, 1988

[54] AMORPHOUS SILICON SOLAR CELLS

[75] Inventors: Jun Tajika, Hiratsuka; Seijiro Sano, Chigasaki; Tsuneo Miyake, Isehara; Osamu Kuboi, Chigasaki, all of Japan

[73] Assignee: Kabushiki Kaisha Komatsu Seisakusho, Tokyo, Japan

[21] Appl. No.: 853,322

[22] Filed: Apr. 18, 1986

Related U.S. Application Data

[63] Continuation-in-part of Ser. No. 646,261, Aug. 3, 1984, abandoned.

[30] Foreign Application Priority Data

Sep. 26, 1983 [JP] Japan .................. 58-176464

[51] Int. Cl.⁴ ........................................... H01L 31/06
[52] U.S. Cl. .................... 136/258; 136/256; 357/30
[58] Field of Search .............. 136/256, 258 AM; 357/30 J, 30 K, 30 Q

[56] References Cited

U.S. PATENT DOCUMENTS

| | | | |
|---|---|---|---|
| 4,491,682 | 1/1985 | Hamakawa et al. | 136/256 |
| 4,500,743 | 2/1985 | Hayashi et al. | 136/258 |
| 4,532,537 | 7/1985 | Kane | 357/30 |
| 4,554,727 | 11/1985 | Deckman et al. | 29/572 |
| 4,599,482 | 7/1986 | Yamazaki | 136/259 |
| 4,644,091 | 2/1987 | Hayashi et al. | 136/259 |
| 4,675,469 | 6/1987 | Iida et al. | 136/259 |
| 4,683,160 | 7/1987 | Bloch et al. | 428/141 |
| 4,689,438 | 8/1987 | Fukatsu et al. | 136/256 |
| 4,694,116 | 9/1987 | Hayashi et al. | 136/256 |

OTHER PUBLICATIONS

*Applied Physics Ltrs.*, vol. 42, No. 11, 1st Jun. 1983, pp.968-970, H. W. Deckman et al.

*Japanese Journal of Applied Physics*—Supplements Technical Digest of the 15th Conference, 1983, pp. 38,39, H. Iida et al.

*Primary Examiner*—Aaron Weisstuch
*Attorney, Agent, or Firm*—Armstrong, Nikaido, Marmelstein & Kubovcik

[57] ABSTRACT

An amorphous silicon solar cell comprising a glass substrate, a transparent conductive film formed on the glass substrate on one side thereof and having micro-columns or fine crystals irregularly formed on the other side, a plurality of amorphous silicon layers superposed on said other side of the conductive film, and a metal electrode formed on the superposed silicon layer. At the interface between the transparent conductive film and the amorphous silicon layer is formed an intermediate layer in which both materials of the conductive film and the silicon layer are mixed. The intermediate layer has a refractive index between the conductive film and the silicon layer. The glass substrate may be substituted with a metal substrate, in which case the plurality of silicon layers are formed directly on the metal substrate, on which the transparent conductive film having an irregular surface on the side opposite to the side where the silicon layers are formed and a metal electrode are formed in this order.

7 Claims, 13 Drawing Sheets

200Å (SnO₂)
800Å (ITO)

FIG. 4(a)
FIG. 4(b)
FIG. 4(c)
200Å (SnO$_2$)
800Å (ITO)
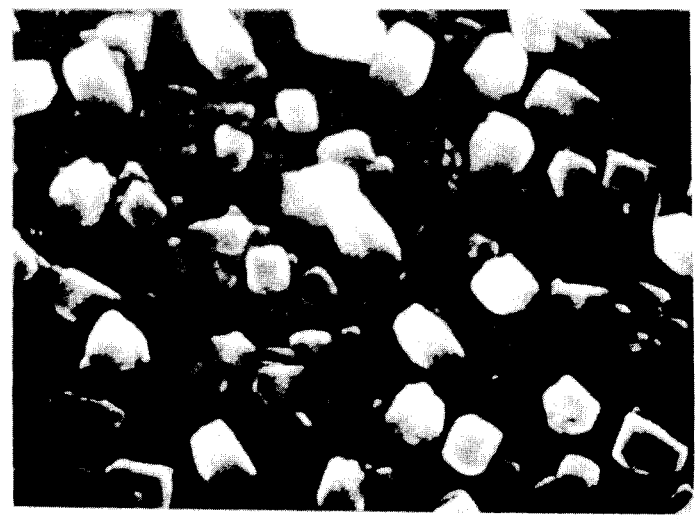

AMORPHOUS SILICON SOLAR CELLS

CROSS REFERENCE TO RELATED APPLICATION

This application is a continuation-in-part application of our prior U.S. application Ser. No. 646,261 filed Aug. 31, 1984, now abandoned.

BACKGROUND OF THE INVENTION

1. Field of the Invention

This invention relates to the art of solar energy and more particularly, to amorphous silicon solar cells with improved light absorption efficiency and reflection-preventing or anti-reflective effect.

2. Description of the Prior Art

For the fabrications of amorphous silicon solar cells, it is the usual practice to use indium tin oxide (ITO) as to transparent electrode because of the excellent conductivity thereof. However, superposition of a plurality of amorphous silicon layers on the transparent electrode is generally carried out by a plasma CVD method or the like in which a gas such as monosilane ($SiH_4$) is decomposed under a low vacuum. The severe decomposition conditions will cause indium tin oxide to deteriorate. To avoid this, the ITO electrode is currently coated on one surface thereof with $SnO_2$ which is stable against plasma though lower in conductivity than ITO. The $SnO_2$-coated transparent electrode has been evaluated with respect to electrical conductivity, stability against plasma, and transparency, and it has been generally accepted that the transparent electrode should preferably be as smooth as possible on the surfaces thereof. In this connection, however, according to our experiments where the surface condition of the transparent electrode was changed, it was found that the absorption efficiency of light was better for a rough surface than a smooth surface.

A typical prior art solar cell comprising plural amorphous silicon layers has such a construction as shown in FIG. 1. A solar cell S comprises a glass substrate 1, on which are superposed a transparent conductive film 2, a plurality of amorphous silicon layers, 3, 4, 5, and a metal electrode 6 in this order. The transparent conductive film 2 formed directly on the glass substrate has not only the function of withdrawing the output voltage of the cell to outside, but also the function of a anti-reflective film in order to reduce the reflectivity of incident light.

While the transparent conductive film made of indium tin oxide has a refractive index of about 2, the amorphous silicon layers 3, 4, 5 each have a refractive index of about 4.0. Because the transparent conductive film 2 has a refractive index value which almost satisfies the conditions for non-reflection, proper choice of the film thickness will result in a small reflectivity at a certain wavelength as will be particularly seen from FIG. 2.

However, while the conductive film has a reflection-preventive effect at a certain wavelength, it exhibits a large reflectivity of incident light at other wavelengths, with the disadvantage that incident light covering a wide range of wavelengths cannot be effectively utilized. The reason why the transparent conductive film in the construction of known solar cells has an anti-reflective effect only at a certain wavelength is due to the fact that the transparent conductive film is formed of a single layer. If the conductive film is made of a multi-layered structure comprising layers having different refractive indices, a wider range of wavelengths will be provided with the anti-reflective effect. This technique has already been carried out in camera lenses but application of the conductive film of the multi-layered structure requires a material having a refractive index, n, intermediate between those of the amorphous silicon layer and the transparent conductive film, i.e. $2 < n < 4$. In addition, such a material should be conductive and optically transparent. Thus, choice of such material is difficult in practice.

SUMMARY OF THE INVENTION

It is an object of the present invention to provide an amorphous silicon solar cell which comprises a transparent conductive film having coarse grains on the surfaces thereof whereby the light absorption efficiency of the conductive film is improved over the efficiency of a smooth transparent conductive film used in known solar cells.

It is another object of the invention to provide an amorphous silicon solar cell which comprises an anti-reflective layer between a transparent conductive film and a plurality of amorphous silicon layers whereby reflectivity of incident light over a wide range of wavelengths can be suppressed to an extent.

It is a further object of the invention to provide an amorphous silicon solar cell which is much improved in output current or short-circuit current.

Broadly, the present invention is characterized by a conductive transparent film which has micro-columns or fine crystals formed at least on one surface thereof at 500 to 2,000 Å in height. The micro-columns exist at a density of about 30 to 90 columns/$\mu m^2$ and each is about 500 to 2,000 Å in diameter. Because of the presence of micro-columns on the surface of the film, light passed through a transparent glass substrate can be efficiently absorbed thereby improving the light absorption efficiency. The coarse grains on the surface are actually made of fine crystals or so-called micro-columns of indium oxide and/or tin oxide. When a first amorphous silicon layer is formed on the coarse grain-bearing surface, the spaces between the micro-columns are filled in by the silicon layer to form an intermediate layer where the micro-columns and the amorphous silicon are admixed. This intermediate layer serves to prevent reflection of light passed through the transparent conductive film because the intermediate layer has a refractive index between the indices of the conductive layer and the amorphous silicon layer. The micro columns-bearing transparent conductive film may be applied to a solar cell of the type which makes use of a metal substrate, instead of the glass substrate, with similar results.

BRIEF DESCRIPTION OF THE DRAWINGS

FIGS. 4(a) to 4(c) through 6(a) and 6(b) are similar to FIGS. 3(a) to 3(c), respectively, in which FIGS. 4(a), 4(b), 5(a), 5(b), and 6(a) show microphotographs of transparent conductive films of solar cells of the present invention and FIGS. 4(c), 5(c), and 6(b) show thicknesses of the films;

DETAILED DESCRIPTION AND EMBODIMENTS OF THE INVENTION

Figure 2:
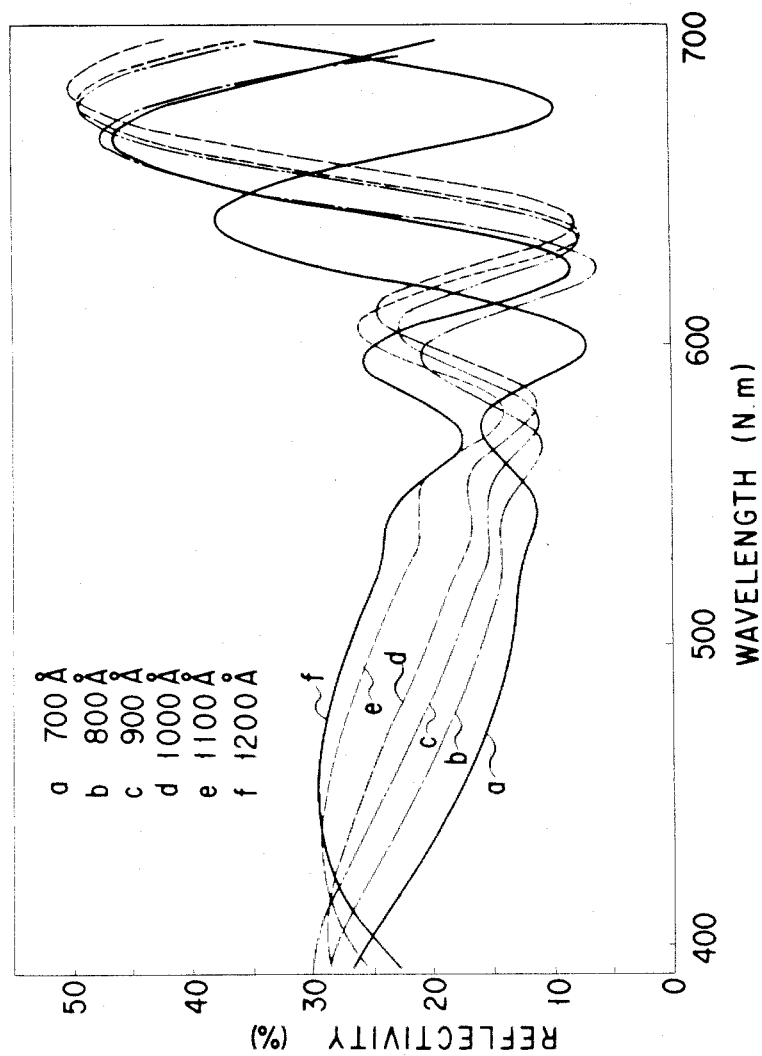
FIG. 2 is a graphical representation of the relation between reflectivity and wavelength for different thicknesses of transparent conductive film.

The general construction of an amorphous silicon solar cell according to the invention is similar to known solar cells and is particularly illustrated with reference to FIG. 1. An amorphous silicon solar cell S of the pin type includes a glass substrate 1 and a transparent conductive film 2 formed on the substrate 1 by vacuum evaporation. On the film 2 are formed a plurality of silicon layers including, for example, a p-amorphous silicon layer 3, an i-amorphous silicon layer 4, and an n-amorphous silicon layer 5. Finally, a metal electrode 6 is formed on the n-amorphous silicon layer 5. Light is passed from the side of the glass substrate 1 as shown.

In the practice of the invention, the transparent conductive film 2 is formed on the glass substrate 1 by vacuum evaporation of indium oxide with or without further deposition of tin oxide. In the known practice, it is generally accepted that the transparent conductive film is deposited so as to be as smooth as possible. However, we have found that the conductive film is preferred to be rough in view of light absorption efficiency. In order to make the surface rough, indium oxide and/or tin oxide is vacuum evaporated by any known technique, such as electron beam vacuum evaporation, under properly controlled conditions by which microcolumns or fine crystals are developed on the surface of the conductive film 2. More particularly, the feed of oxygen and the evaporation speed are controlled so that fine crystals or micro-columns having a maximum height of 500 to 2000 angstroms are formed on the conductive film 2 which has usually a thickness of from 500 to 2000 angstroms. These dimensions are very minute and should be experimentally confirmed. Usually, the vacuum evaporation conditions useful in the present invention are as follows: the feed of oxygen is 2 to 5 cc/min.; the evaporation speed is from 5 to 10 angstroms/sec.; the temperature of the substrate is from 300° to 400° C.; and the evaporation time is from 1 to 4 minutes.

Figure 3A:
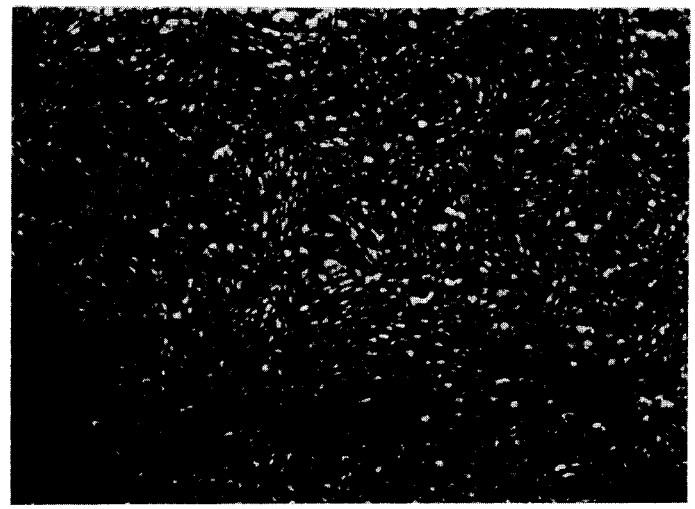
FIGS. 3(a) and 3(b) are microphotographs of a surface structure of a known transparent conductive film and FIG. 3(c) is a schematic view showing a thickness of the conductive film.
Figure 3B:
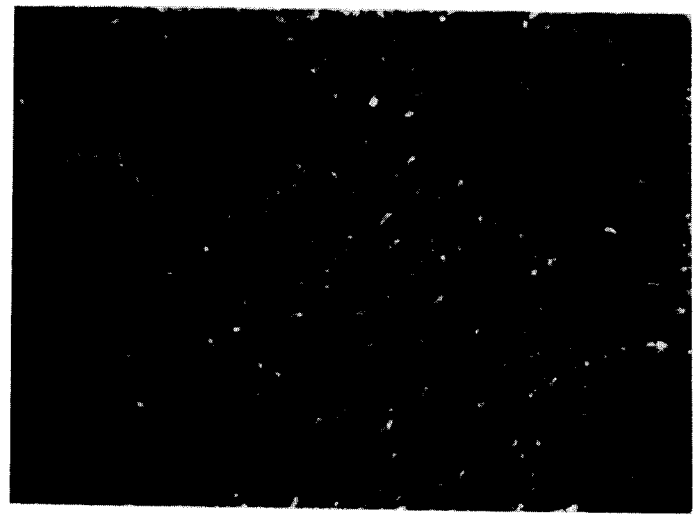
Figure 3C:
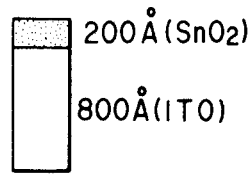
Figure 5A:
Figure 5C:
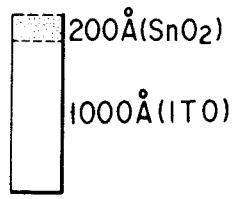
Figure 5B:
Figure 6A:
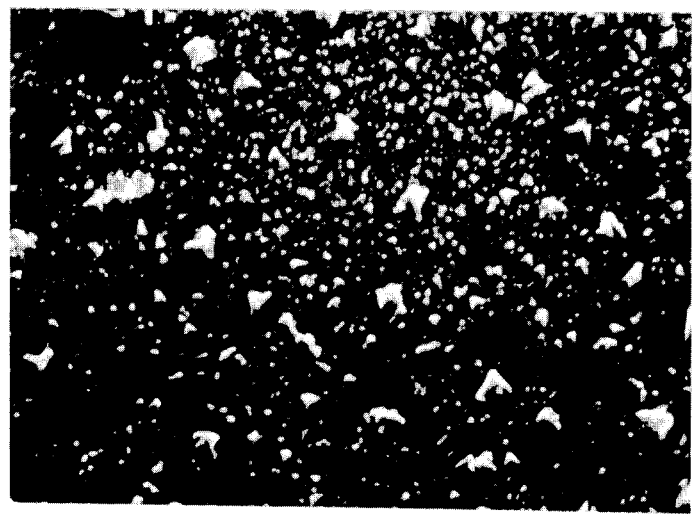
Figure 6B:
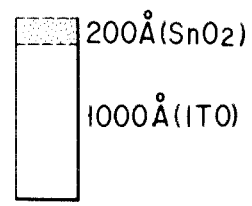

Under different vacuum evaporation conditions, transparent conductive films having different microcolumns are formed on glass substrates. The microphotographs of these films are shown in FIGS. 3 through 6. Each film consists of an indium-tin oxide layer of 800 angstroms in thickness and a tin oxide layer of 200 angstroms in thickness as particularly shown in FIGS. 3(c), 4(c), 5(c), and 6(b). The microphotographs of FIGS. 3(a) and 3(b) indicate a smooth transparent conductive film obtained according to a known procedure, revealing that the surface is very smooth. In the photographs, the magnifications in FIGS. 3(a) and 3(b) are indicated as 50.4 KX and 99.8 KX which mean $50.4 \times 10^3$ and $99.8 \times 10^3$ magnifications, respectively. This is also applicable to the other microphotographs.

As will be seen from FIGS. 4(a), 4(b), 5(a), 5(b), and 6(a) showing the microphotographs of the conductive films of the invention, cubic or columnar grains or crystals are formed on the film surface which is thus made rough.

Figure 1:
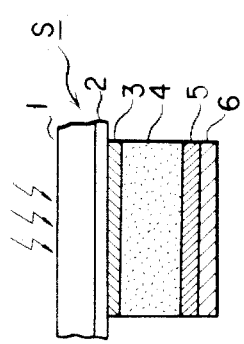
FIG. 1 is a schematic sectional view of a typical construction of a conventional amorphous silicon solar cell.

On the conductive film as shown in these figures are further formed a plurality of silicon layers and a metal electrode to obtain solar cells having a construction as shown in FIG. 1.

Figure 7:
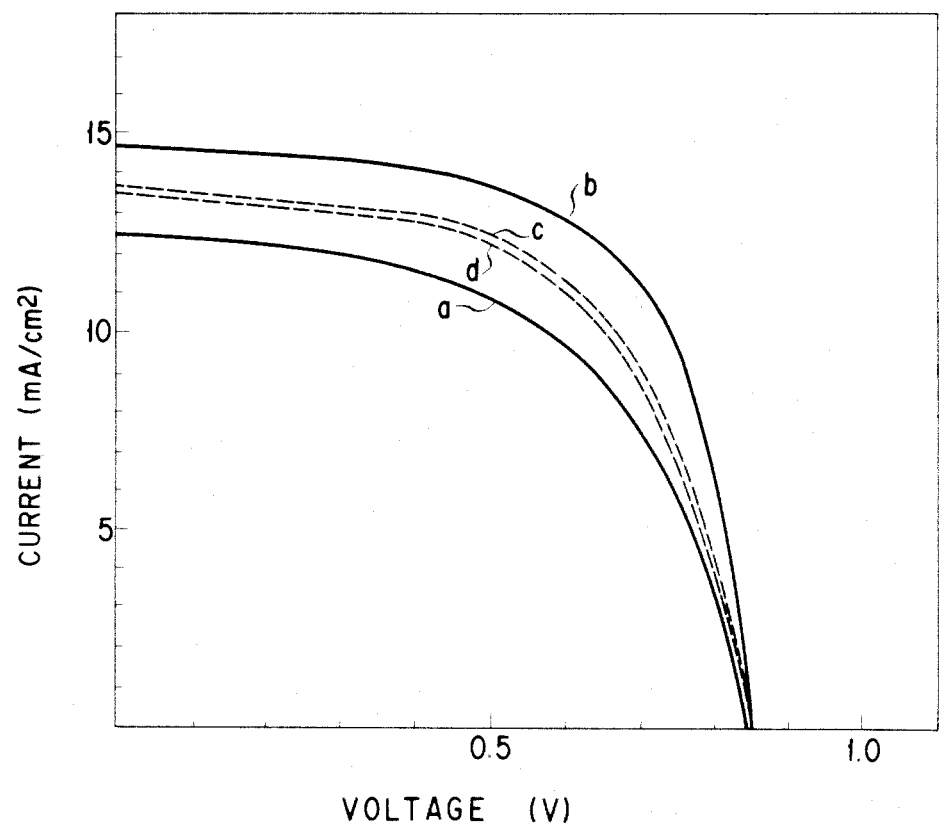
FIG. 7 is a graphical representation of output characteristics of solar cells using the transparent conductive films indicated in FIGS. 3 through 6, respectively.

These cells are each subjected to measurement of the output characteristic. The output characteristic of the known solar cell using the conductive film shown in FIG. 3 is indicated as curve a in FIG. 7. The solar cells of the invention using the conductive films shown in FIGS. 4 through 6 have the output characteristic curves b, c, and d, respectively. From the results of FIG. 7, it will be noted that rougher surfaces result in better output characteristic.

The characteristics of the solar cells including open circuit voltage, Voc, short-circuit current, Isc curve fill factor, FF, and conversion efficiency, $\eta$, are shown in Table I below. In the table, samples Nos. a, b, c, and d correspond to the solar cells using the conductive films indicated in FIGS. 3 through 6, respectively.

TABLE I

| Sample No. | Voc (mV) | Isc (mA/cm$^2$) | FF (%) | $\eta$ (%) |
|---|---|---|---|---|
| a | 839 | 12.34 | 56.9 | 5.89 |
| b | 855 | 14.69 | 63.7 | 8.01 |
| c | 852 | 13.68 | 60.1 | 7.00 |
| d | 841 | 13.31 | 60.8 | 6.81 |

Thus, the known solar cell of Sample a is poorer than the solar cells of the present invention in all the characteristics. This is considered to be due to the fact that the rough or irregular surface of the conductive film contributes to reduce the reflection loss and increase the light absorption efficiency as compared with the smooth conductive film surface.

The transparent conductive film having irregular or rough fine crystals or micro-columns formed thereon may also be applied to a solar cell of the type which comprises in order a metal substrate such as SUS, a plurality of amorphous silicon layers superposed on the substrate, a transparent conductive film, and a metal electrode. In this case, although the order of the superposed layers is different from the solar cell using a glass substrate, similar results are obtained.

Figure 8:
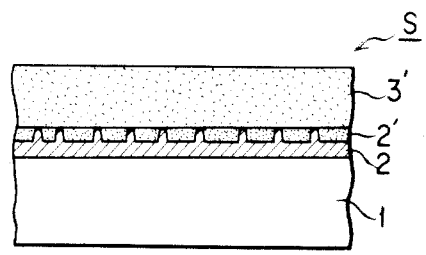
FIG. 8 is a schematic sectional view of a solar cell illustrating an intermediate layer formed between a transparent conductive film and an amorphous silicon layer according to the present invention.

Especially, when the plurality of amorphous silicon layers are formed on the micro-column bearing conductive film, an intermediate layer is established between the conductive film and the first silicon layer. This is particularly shown in FIG. 8 in which the plurality of amorphous silicon layers are generally indicated at 3' and the intermediate layer is indicated at 2'. The intermediate layer is made of indium oxide and/or tin oxide and the amorphous silicon. The refractive index of the intermediate layer 2' depends on the mixing ratio of the oxide and the amorphous silicon and is intermediate between 2 and 4. An approximate value of the refractive index of the intermediate layer can be calculated according to the Maxwell-Garnet equation. According to the Maxwell-Garnet equation, if the filling rate of the spaces between the micro columns or crystalline grains of the transparent conductive film 2 in the intermediate layer 2' increases, the refractive index of the intermediate layer 2' comes close to the refractive index of the conductive film 2. On the other hand, when the filling rate decreases, the refractive index of the intermediate layer 2' becomes close to the refractive index of the amorphous silicon layer. In order to reduce the reflectivity between the conductive film and the amorphous silicon layer, the intermediate layer 2' should preferably have a refractive index of about 3.0. In order to attain such a value, formation of crystalline grains is properly controlled by controlling the evaporation conditions, by which an optimum filling rate can be achieved.

Figure 9A:
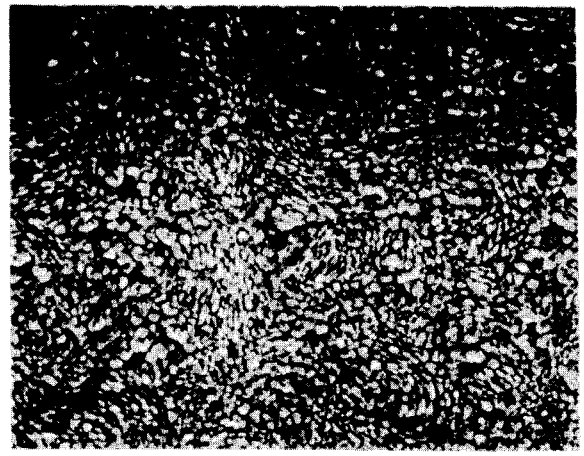
FIGS. 9(a) through 9(c) are microphotographs of transparent conductive films formed under different treating conditions.
Figure 9B:
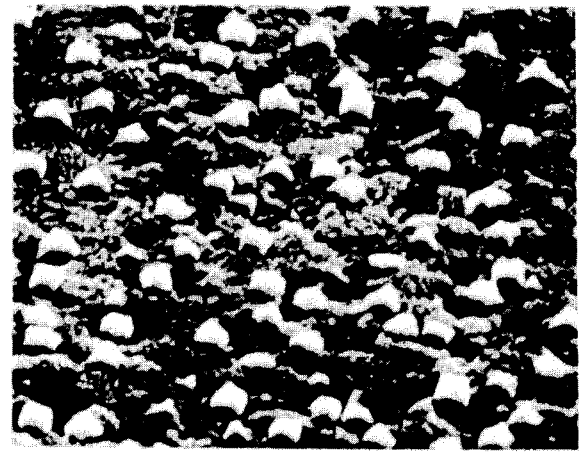
Figure 9C:
Figure 10:
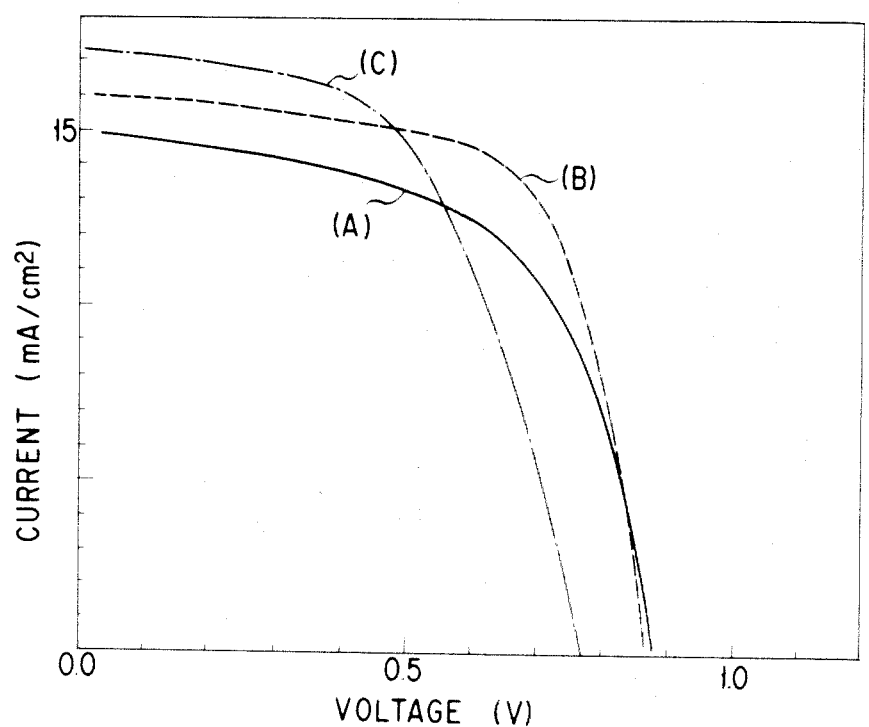
FIG. 10 is a graphical representation of the relation between electric current and voltage of solar cells using the transparent conductive films shown in FIGS. 9(a) through 9(c), respectively.
Figure 11:
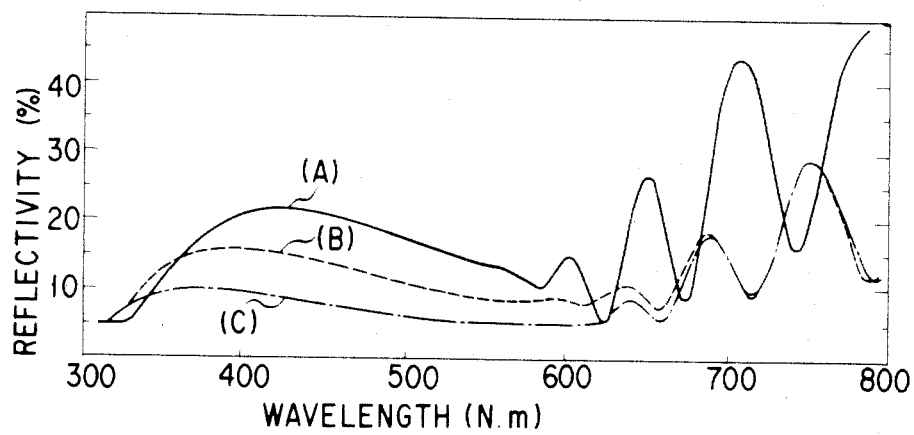
FIG. 11 is a graphical representation of the relation between reflectivity and wavelength for solar cells using the transparent conductive films of FIGS. 9(a) through 9(c), respectively.

In order to confirm the effect of the intermediate layer, three samples are fabricated by vacuum evaporating indium oxide and then tin oxide on a glass substrate under conditions of oxygen feed of 10 cc/min., evaporation rate of 1 angstrom/sec. and substrate temperature of 250° C. (sample A); oxygen feed of 3 cc/min., evaporation rate of 8 angstroms/sec. and substrate temperature of 350° C. (sample B); and oxygen feed of 1 cc/min., evaporation rate of 15 angstroms/sec. and substrate temperature of 420° C. (sample C). These samples are subjected to electron microscopic observation with a magnification of 50 KX and microphotographs thereof are shown in FIGS. 9(a) through 9(c). The sample A of FIG. 9(a) has a smooth surface and is a known conductive film. These samples are subsequently formed with a plurality of amorphous silicon layers and a metal electrode as usual. The output characteristic and reflectivity of these samples are measured with the results shown in FIGS. 10 and 11; rougher surfaces of the conductive film result in a lower reflectivity over a wider range of wavelength and a higher output current or short-circuit current.

The foregoing micro-columns formed on the transparent conductive film exist at the density of 30 to 90 columns/$\mu m^2$. Further, the size of each micro-column is about 500 to 2,000 Å in height and in diameter.

The above definitions of the micro-columns will be further explained hereinafter with reference to FIGS. 12 to 17.

Figure 12:
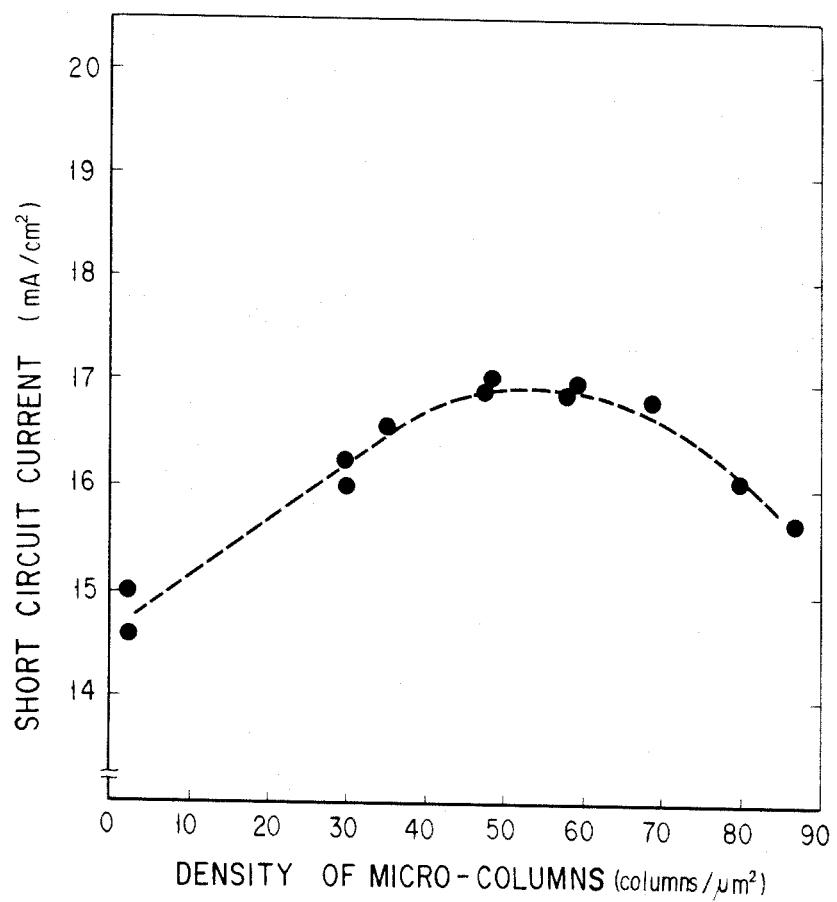
FIG. 12 is a graph showing the effect of microcolumn density on short circuit current.

First of all, FIG. 12 is a graph showing the effect of micro-column density on short circuit current. As is clearly understood from the graph, when the density of micro-columns is 30 columns/$\mu m^2$ or more, the short circuit current of the solar cell is increased by 1 to 2 mA/cm$^2$ thereby improving the conversion efficiency remarkably. On the other hand, when the density of micro-columns exceeds 90 columns/$\mu m^2$, the above effect is diminished.

Figure 13:
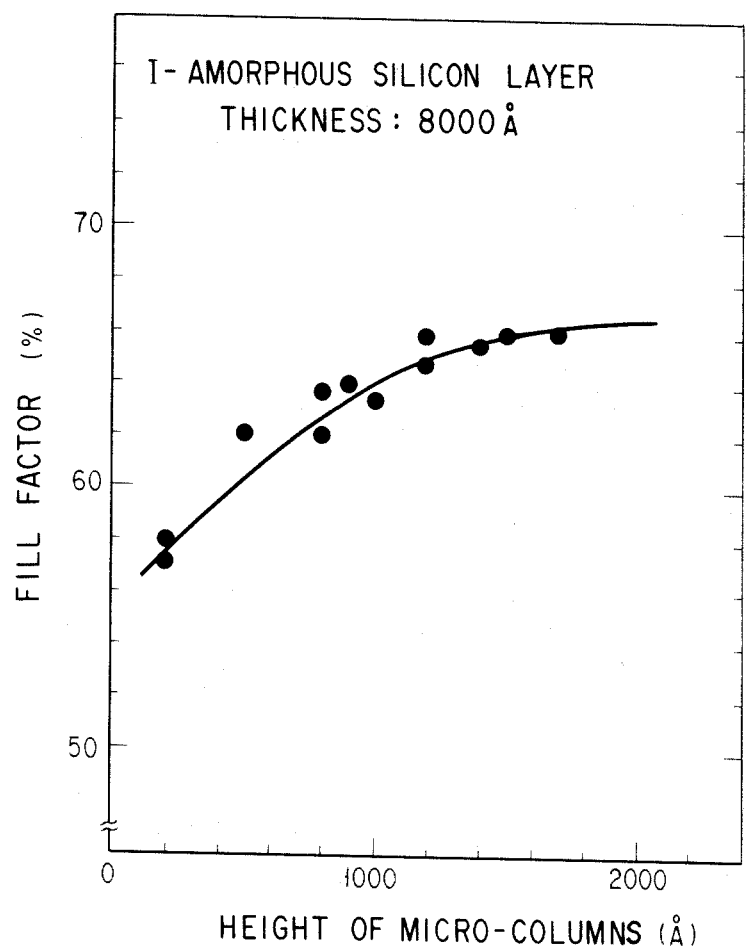
FIG. 13 is a graph showing the effect of microcolumn height on film factor.

FIG. 13 is a graph showing the effect of micro-column height on the fill factor. According to FIG. 13, when the height of the micro-column becomes 500 Å or more, the fill factor of the solar cell is remarkably increased, so that the conversion efficiency is remarkably improved also. However, if the height exceeds 2,000 Å, it is disadvantageous because the yeild of the solar cell is decreased. The preferred height range is 500 to 1000 Angstroms.

Figure 14:
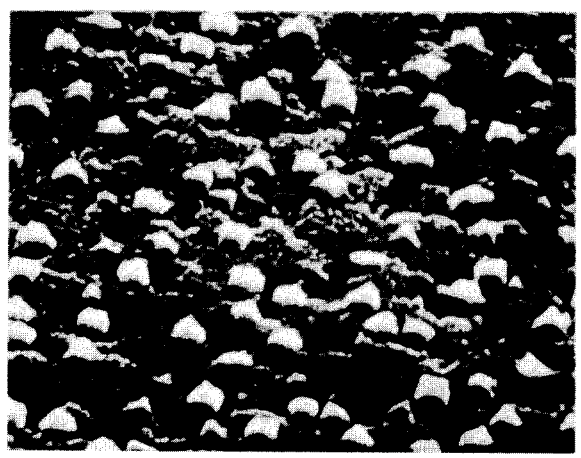
FIGS. 14 and 15 are microphotographs of surface structures of transparent conductive films in samples D and E of the present invention, respectively.
Figure 15:
Figure 16:
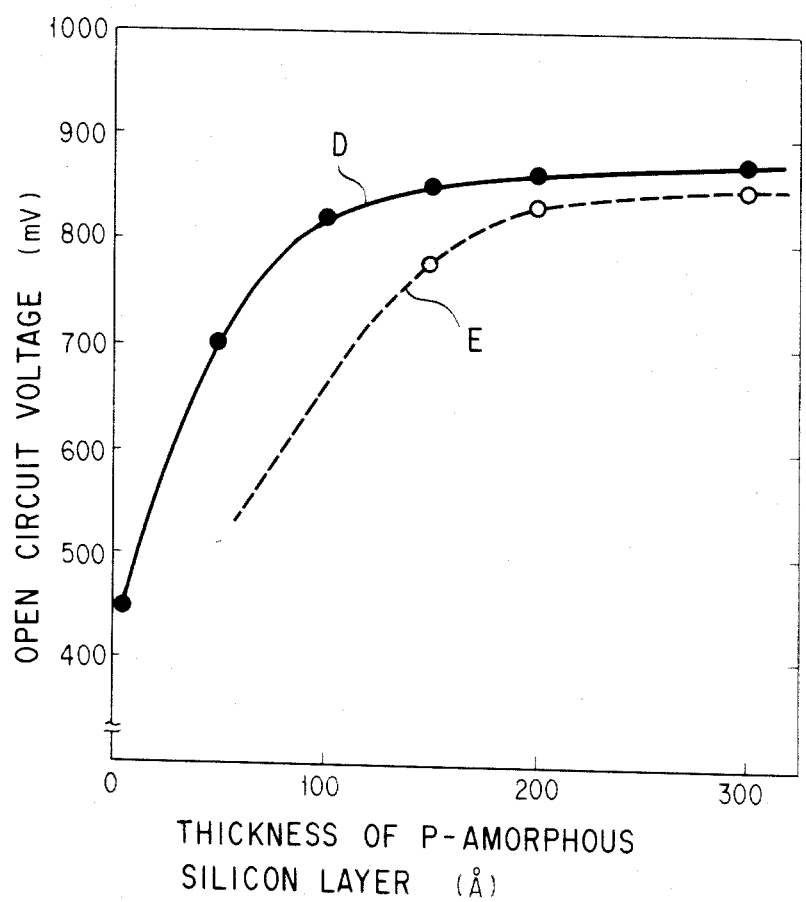
FIG. 16 is a graph showing the effect of microcolumn height on open circuit voltage with relation to the samples D and E shown in FIGS. 14 and 15, respectively.

FIG. 16 is a graph showing the effect of the micro-columns on open circuit voltage in relation to two other samples D and E of different micro-column height. Microphotographs of transparent conductive films of these samples D and E are shown in FIGS. 14 and 15, respectively. As is clearly understood from FIG. 16, in order to obtain a desired open circuit voltage of the solar cell, the height of the micro-columns determines the thickness of p-amorphous silicon layer, that is, the greater the height of the micro-column, the greater the thickness of p-amorphous silicon layer.

Figure 17:
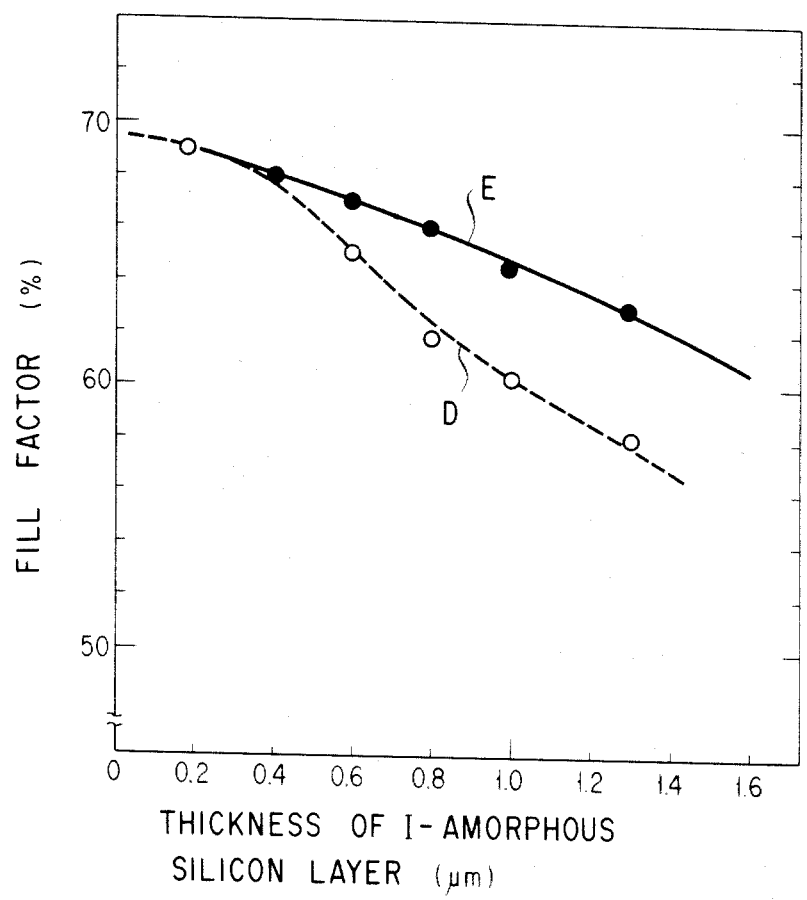
FIG. 17 is a graph showing the effect of microcolumn height on fill factor with relation to the samples D and E shown in FIGS. 14 and 15, respectively.

Lastly, FIG. 17 is a graph showing the relationship between the height of the micro-columns and the fill factor of the solar cell with reference to the samples 14 and 15. As is clearly understood from this graph, there is a fixed relationship therebetween. Namely, when the height of the micro-column is 1,500 to 2,000 Å as described above, the decrease of the fill factor is low even when the thickness of i-amorphous silicon layer becomes large.

What is claimed is:

1. An amorphous silicon solar cell comprising a glass substrate, a transparent conductive film formed on said glass substrate by electron-beam vapor deposition and having micro-columns of fine cubic crystals irregularly formed thereon, a plurality of amorphous silicon layers formed on said transparent conductive film, and a metal electrode formed on the amorphous silicon layers, characterized in that said micro-columns formed on the transparent conductive film have a density of 30 to 90 columns/$\mu m^2$ and each column is 500 to 1,000 angstroms in height and in diameter.

2. The solar cell according to claim 1 wherein said transparent conductive film is made of indium oxide.

3. The solar cell according to claim 1 wherein said transparent conductive film is made of an indium oxide layer and a tin oxide layer formed in this order.

4. The solar cell according to claim 1 wherein the height of said micro-columns is preferably 800 to 1,000 angstroms.

5. The solar cell according to claim 1 wherein said transparent conductive film having micro-columns irregularly formed thereon is formed by vacuum evaporation under conditions of oxygen feed of 2 to 5 cc/min., evaporation speed of 5 to 10 angstroms/sec. and substrate temperature of 300° to 400° C.

6. The solar cell according to claim 1 wherein the plurality of amorphous silicon layers consists of a p-amorphous silicon layer, an i-amorphous silicon layer, and an n-amorphous silicon layer formed on said conductive film in this order.

7. The solar cell according to claim 1 wherein the fine crystals are embedded in one of the amorphous silicon layers contacting therewith to form an intermediate layer having a refractive index intermediate between refractive indices of said conductive film and the one amorphous silicon layer whereby reflection of light passed from the conductive film toward the amorphous silicon layers is suppressed.

* * * * *

UNITED STATES PATENT AND TRADEMARK OFFICE
CERTIFICATE OF CORRECTION

PATENT NO. : 4,746,372
DATED : May 24, 1988
INVENTOR(S) : Jun TAJIKA et al

It is certified that error appears in the above-identified patent and that said Letters Patent is hereby corrected as shown below:

On the cover page, Item [73], after "Japan", insert --Komatsu Electronic Metals Co., Ltd., Tokyo, Japan--.

Signed and Sealed this

Thirteenth Day of December, 1988

Attest:

DONALD J. QUIGG

*Attesting Officer*    *Commissioner of Patents and Trademarks*